United States Patent [19]
Kassapian

[11] Patent Number: 5,589,793
[45] Date of Patent: Dec. 31, 1996

[54] VOLTAGE BOOSTER CIRCUIT OF THE CHARGE-PUMP TYPE WITH BOOTSTRAPPED OSCILLATOR

[75] Inventor: Christian G. Kassapian, Marseille, France

[73] Assignee: SGS-Thomson Microelectronics S.A., Saint Genis Pouilly, France

[21] Appl. No.: 128,871

[22] Filed: Sep. 29, 1993

[30] Foreign Application Priority Data

Oct. 1, 1992 [FR] France .................................. 92 11751

[51] Int. Cl.⁶ .................................................. H03K 3/00
[52] U.S. Cl. ........................ 327/536; 327/258; 327/259; 327/530; 327/291; 327/295; 327/239; 327/306
[58] Field of Search ........................................ 307/262, 264, 307/263, 363, 296.2, 513; 331/57, 46; 327/291, 258, 589, 596, 536, 548, 534, 535, 144, 145, 295, 259, 239, 306, 530

[56] References Cited

U.S. PATENT DOCUMENTS

| 4,409,496 | 10/1983 | Baba ........................................ 327/536 |
| 5,097,226 | 3/1992 | Pascucci et al. ......................... 331/57 |
| 5,202,588 | 4/1993 | Matsuo et al. .......................... 327/536 |
| 5,394,372 | 2/1995 | Tanaka et al. .......................... 327/536 |

FOREIGN PATENT DOCUMENTS

| 0350462 | 1/1990 | European Pat. Off. . |
| 0445083 | 9/1991 | European Pat. Off. . |
| 2379198 | 8/1978 | France . |
| 0090129 | 7/1980 | Japan ..................................... 302/556 |
| 2096422 | 4/1990 | Japan ..................................... 327/259 |

Primary Examiner—Timothy P. Callahan
Assistant Examiner—Dinh T. Le
Attorney, Agent, or Firm—David M. Driscoll; James H. Morris; Brett N. Dorny

[57] ABSTRACT

The invention relates to charge-pump circuits used for the generation, in an integrated circuit, of an internal supply voltage Vpp which is considerably greater than the external supply voltage Vcc. In a charge pump configuration with capacitors and transistors, certain transistors must be driven by bootstrapped logic signals, i.e., having a logic level which is greater than Vcc in order to overcome the threshold voltage of the transistors. According to the invention, there is an oscillator followed by a phase splitter stage which is in turn followed by a bootstrap amplifier stage. The oscillator is a ring oscillator having a number of logic gates which is as small as possible, preferably only three. A satisfactory frequency stability of the charge pump is thus obtained and therefore its design is made easier and its adaptability to various electronic circuits is improved.

23 Claims, 4 Drawing Sheets

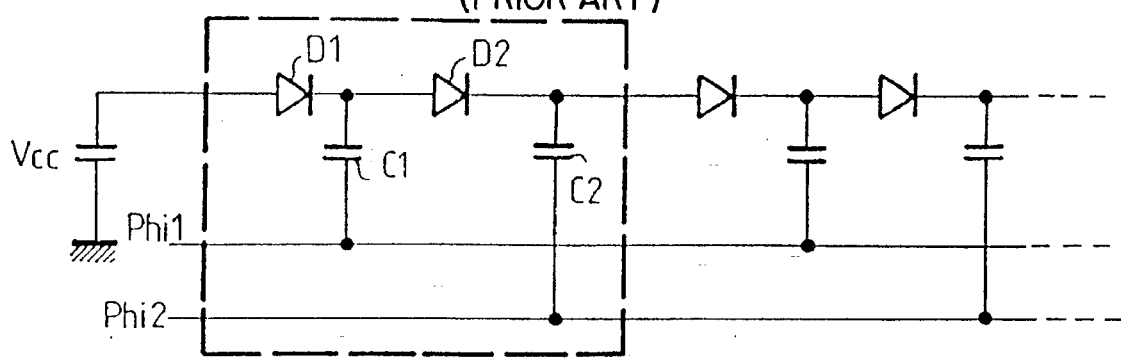
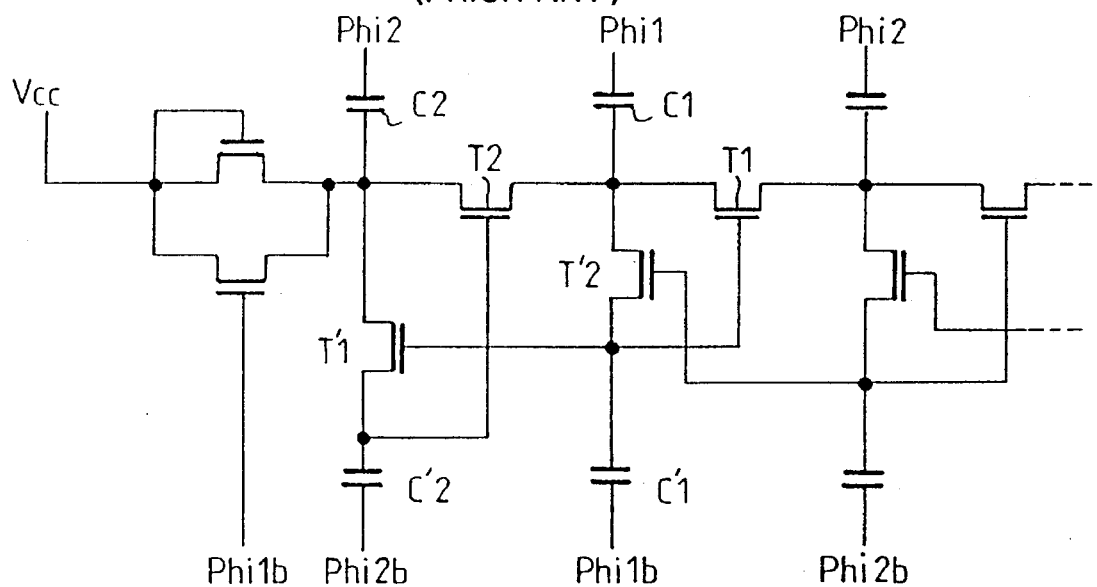
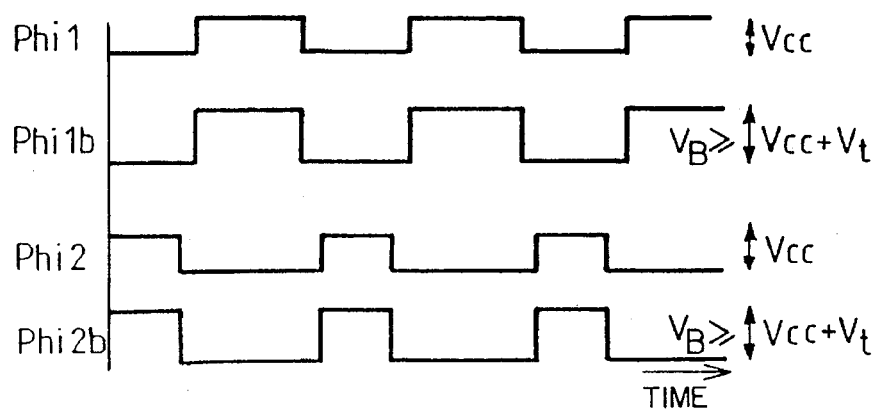

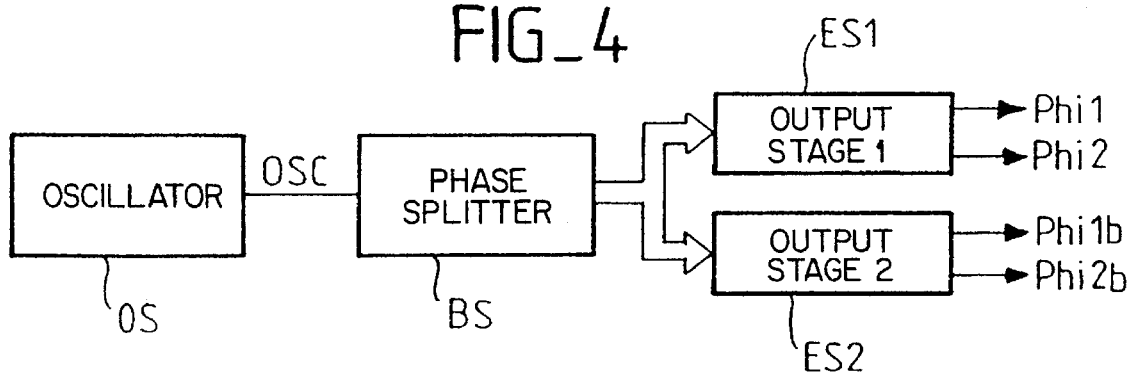
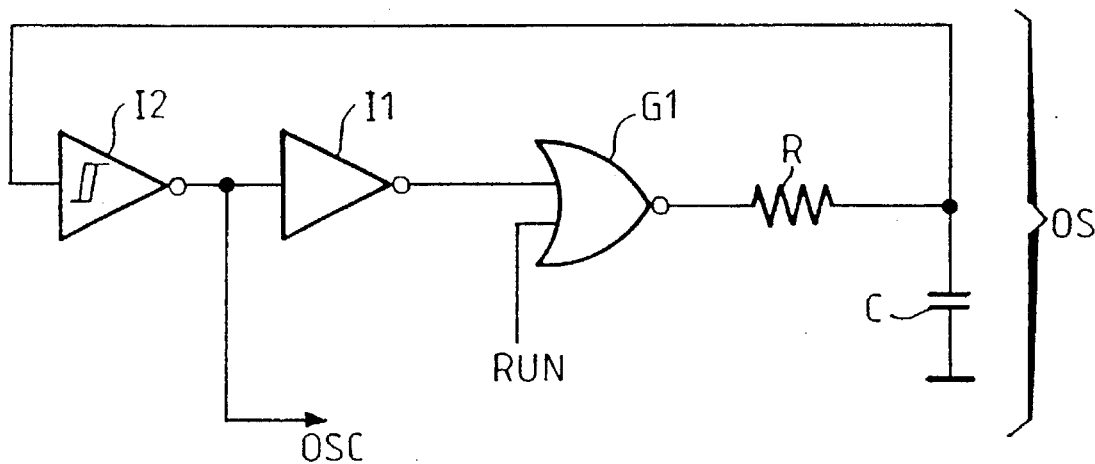
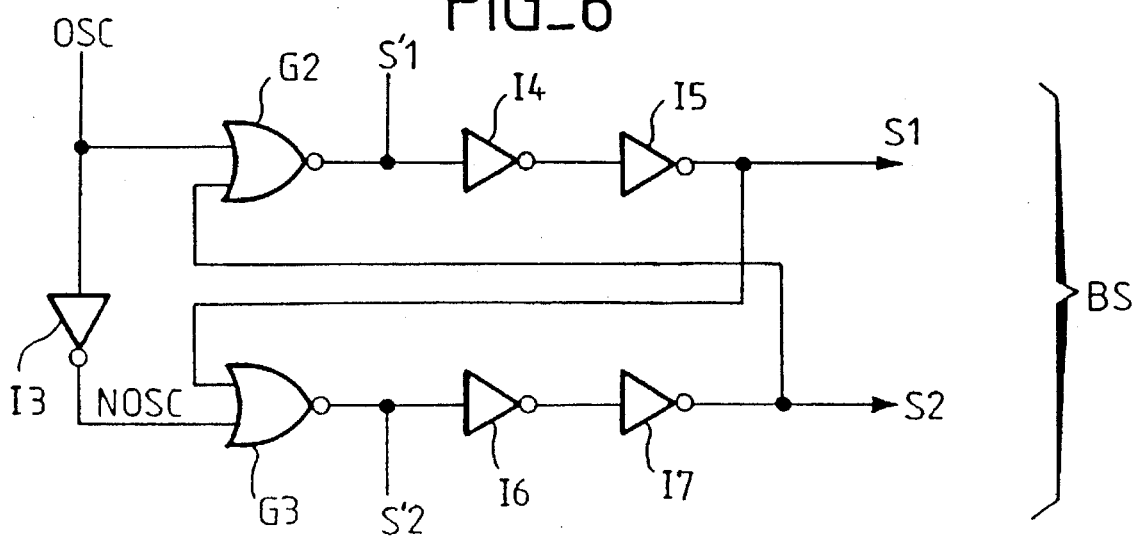

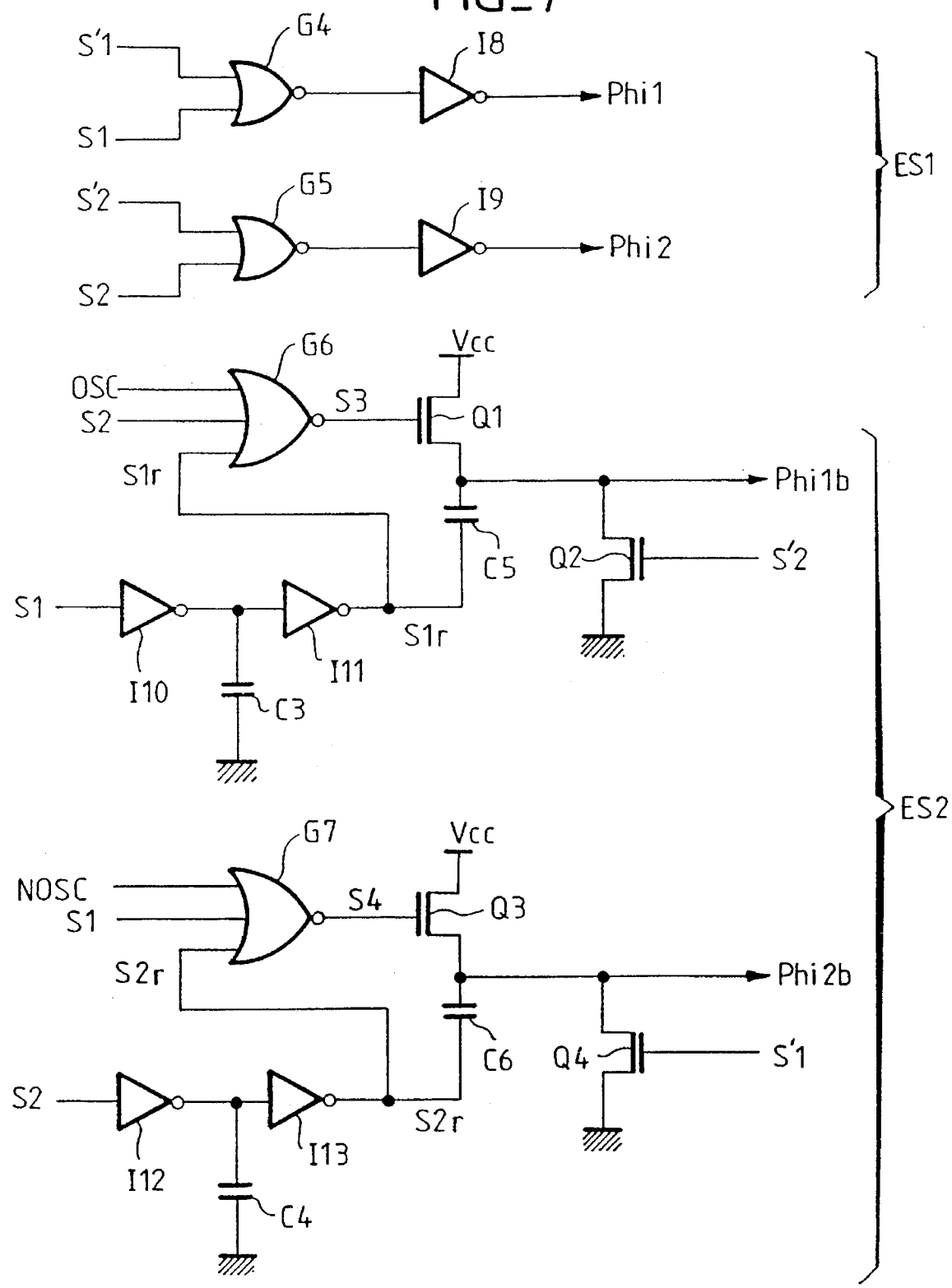

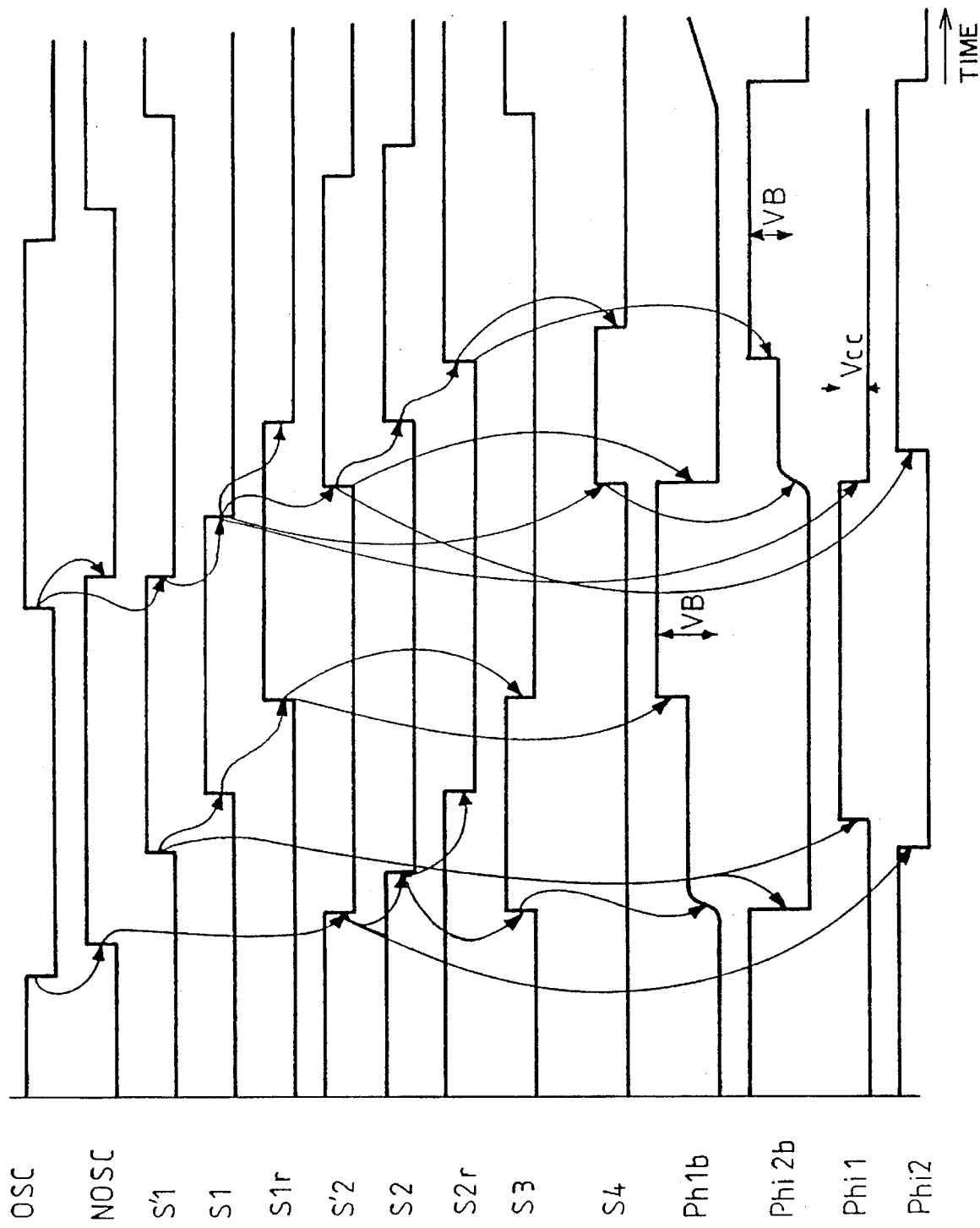
FIG_8

5,589,793

VOLTAGE BOOSTER CIRCUIT OF THE CHARGE-PUMP TYPE WITH BOOTSTRAPPED OSCILLATOR

BACKGROUND OF THE INVENTION

1. Field of the Invention

This invention relates to electronic circuits supplied with a voltage Vcc in which a voltage greater than Vcc must be generated.

2. Discussion of the Related Art

A typical example is that of integrated circuits comprising non-volatile memories with floating-gate transistors; programming such memories requires a programming voltage Vpp much greater than the normal supply voltage Vcc. In order to allow the user to use this memory with only one supply voltage Vcc, measures are taken for the integrated circuit to have an internal means to generate the voltage Vpp from Vcc. Typically, Vcc has a value of 5 volts or even less and Vpp has a value of 15 volts or more. The future trend is toward a voltage Vcc lower than 2 volts, while Vpp can be above 15 volts.

The circuit for the generation of Vpp is a voltage booster circuit whose principle is that of the "charge pump".

The block diagram of the charge pump is shown in FIG. 1. The charge pump comprises a series of diode and capacitor stages and switches providing for the switching of the capacitor connections between Vcc and ground and depending on two non-overlapping periodic phases Phi1, Phi2. Each stage includes two capacitors C1 and C2 and two diodes D1 and D2. In the first phase of Phi1, the first capacitor C1 is charged to the supply voltage Vcc. In the second phase of Phi2, it is partly discharged into the second capacitor C2. Then C1 is charged (Phi1) again. The diodes prevent the second capacitor C2 from discharging, so that its load progressively increases until it reaches a value which exceeds Vcc (up to a theoretical maximum of 2 Vcc if the voltage drops in the diodes are not taken into account).

In order to obtain a higher voltage, n successive stages are cascade-connected. The obtained voltage amounts to (n+1)Vcc or, more precisely, if the threshold voltage Vd of the diodes is taken into account, to (n+1) (Vcc−Vd).

In order to obtain a sufficient output voltage value with the smallest possible number n of stages, it has already been suggested to replace the diodes D1 and D2 with transistors, across which no significant voltage drop is created because their resistance is negligible when they are in conductive mode. The block diagram in FIG. 2 shows this. Since the transistors have a threshold voltage Vt (minimum gate-to-source voltage below which they are not conductive), certain transistors are arranged to have their gates driven by a voltage level which is higher than (Vcc+Vt). Thus they are made conductive (i.e., no significant voltage drop across them) even if their sources and their drains are at Vcc, which eliminates the threshold voltage problem. With a charge pump comprising n stages, an output voltage up to (n+1)Vcc can be obtained, which is more favourable than the result of diode circuits. But it implies that the gates of certain transistors can be driven using a voltage slightly greater than Vcc.

For this reason, the charge pump diagram in FIG. 2 shows two drive signal pairs: Phi1 and Phi2 on the one hand as shown in FIG. 1, which switch between two voltage levels 0 and Vcc; and Phi1b and Phi2b on the other hand, synchronized with Phi1 and Phi2 respectively, but switching between voltage levels 0 and VB, where VB has a greater level than Vcc, preferably greater than or equal to Vcc+Vt. FIG. 3 shows schematically the switching phases of the charge pump according to FIG. 2.

A significant parameter of the charge pump is its "fan-out", which is the number of loads it can supply without any excessive output voltage attenuation. Computations show that the fan-out is inversely proportional to the number of stages of the pump and is proportional to the switching frequency of the pump, i.e., the frequency of signals Phi1, Phi2, Phi1b, Phi2b.

Therefore, the switching frequency must be quite stable, or at least it should decrease as little as possible when the number of stages of the pump increases. It is also desirable that the switching frequency be as stable as possible with respect to the supply voltage Vcc.

In order to generate switching drive signals Phi1, Phi2, Phi1b, and Phi2b, it has already been suggested to use comparatively complex oscillator circuits which have the disadvantage of a poor frequency stability, both with respect to the supply voltage changes and also with respect to the number of stages or, more generally, to the structure of the charge pump they actually control.

Therefore, the circuits utilized in the prior art have a charge pump frequency which depends on the number of the charge pump stages in a significant way, which makes the circuit design rather difficult and thus general-purpose diagrams, capable of being transposed from one circuit to another one, cannot be drawn for the charge pump.

It is an object of this invention to provide an improved charge pump diagram.

SUMMARY OF THE INVENTION

The present invention provides a charge pump making use of multiple transistor and capacitor stages with a transistor switching control circuit. The switching control circuit comprises a ring oscillator delivering a signal at a frequency F and is followed by a phase splitter stage in order to deliver from the oscillator output two non-overlapping switching phases at the oscillator frequency. The control circuit further comprises a first output stage to deliver from the signals generated by the splitter stage two non-overlapping signals Phi1 and Phi2 capable of switching between a zero voltage and a voltage Vcc and a second bootstrapped output stage to deliver from signals coming from the splitter stage two signals Phi1b and Phi2b, capable of switching in synchronously with Phi1 and Phi2, but between a zero voltage and a voltage VB greater than Vcc.

Oscillators capable of delivering the signals Phi1, Phi2, Phi1b, and Phi2b were available in the prior art, but these oscillators did not separate the oscillation, non-overlapping and bootstrap-type amplification functions; the non-overlapping and bootstrap amplification functions were inserted in the oscillation loop. This resulted in the frequency instability which is corrected for by the invention. That was for example typically the case for a circuit described in a EP-A-0 445 083 patent application. There amplifiers D and D' are inserted in oscillator loops.

Preferably, the ring oscillator is an oscillator with only three logic gates, one of which is a threshold inverter gate. This type of oscillator, which minimizes the number of logic gates, offers the advantage of generating a frequency which has little dependence on the supply voltage.

Other features and advantages of the invention are more readily apparent from the following detailed description taken in conjunction with the accompanying drawings.

BRIEF DESCRIPTION OF THE DRAWINGS

FIG. 1 illustrates a charge pump having diodes and capacitors;

FIG. 2 illustrates a charge pump having transistors and capacitors;

FIG. 3 illustrates switching signals associated with the charge pump according to FIG. 2;

FIG. 4 illustrates a switching control circuit according to the invention;

FIG. 5 illustrates an oscillator diagram useful for the implementation of the invention;

FIG. 6 illustrates a phase splitter circuit diagram useful for the implementation of the invention;

FIG. 7 illustrates a diagram of bootstrapped and non-bootstrapped output stages, which can be used in the switching control circuit according to the invention;

FIG. 8 illustrates the logic signals in various spots of the circuit according to the invention.

DETAILED DESCRIPTION

FIG. 4 shows the general arrangement of the switching control circuit used in a charge pump according to the invention.

The charge pump is a pump such as that shown in FIG. 2. It comprises multiple cascaded stages, including transistors and capacitors, and a switching control circuit generating the four switching phases Phi1, Phi2, Phi1b, and Phi2b. Phi1 and Phi2 are two complementary though non-overlapping phases, switching between two values, which substantially are 0 and Vcc (Vcc being the supply voltage of the circuit). Phi1b and Phi2b are phases substantially synchronized with Phi1 and Phi2, respectively, and switching between two voltage values, which substantially are 0 and VB, where VB is greater than Vcc and preferably greater than Vcc+Vt (Vt is the threshold voltage of the transistors driven by phases Phi1b and Phi2b). While Phi1 and Phi2 are non-bootstrapped signals, Phi1b and Phi2b are bootstrapped signals capable of exceeding the voltage Vcc. The term "bootstrap" refers to a technique for generating a logic signal which is artificially enhanced with respect to its normal value, in general by means of a capacitor which is precharged prior to being series-connected between the signal to be enhanced and the terminal on which the enhanced signal is to appear.

The switching control circuit according to FIG. 4 therefore gives the four phases Phi1, Phi2, Phi1b, and Phi2b. It comprises an oscillator OS generating a periodic signal OSC having a frequency F, a phase splitter circuit BS to generate, from the signal OSC, various complementary though non-overlapping signals at the frequency F, and, lastly, two output stages ES1 and ES2 making use of these signals to generate signals Phi1 and Phi2 which are not bootstrapped (stage ES1) and signals Phi1b and Phi2b, which are bootstrapped (stage ES2).

Preferably, the oscillator is a ring oscillator with a very small number of logic gates, preferably only three, for optimum stability with respect to changes in the supply voltage. The preferred diagram is that in FIG. 5. It preferably includes inverter I1, which has its output connected to the first input of NOR gate G1, which has its input driven by a signal RUN; the signal RUN enables or disables the oscillator operation. The G1 NOR gate output is connected through an RC time-constant circuit to the input of another inverter, preferably a threshold inverter (in particular, a Schmitt trigger). The output of inverter I2, which is fed back to the input of inverter I1, forms the output of the oscillator generating the signal OSC. The oscillation frequency mainly depends on the respective values of R and C and on the threshold of inverter I2 and, to a lesser extent, on the switching times of the inverters I1 and I2 and gate G1.

The phase splitter stage BS is preferably made up as shown in FIG. 6. It receives, as an input signal, the signal OSC generated by the oscillator OS. This signal is inverted in an inverter I3 to generate a signal NOSC. The positive-going edges of NOSC are slightly delayed with respect to the negative-going edges of OSC and, in the same way, the negative-going edges of NOSC are slightly delayed with respect to the positive going edges of OSC, owing to the delay inevitably induced by inverter I3.

The timing diagrams of the periodic switching signals generated by the circuitry according to the invention are shown in FIG. 8 and they can be referred to for a better understanding of the circuit operation. The same reference marks were intentionally chosen to designate the circuit nodes and the switching signals appearing at these nodes, both in the above-mentioned diagram and in the following explanations.

The phase splitter circuit BS, whose function consists of generating two complementary non-overlapping periodic phases at frequency F, has two outputs S1 and S2. They are non-overlapping and complementary in that the positive-going edge of S1 begins after the end of the negative-going edge of S2, and the negative-going edge of the following S1 appears before the next positive-going edge of S2.

The signal OSC is applied to an input of a NOR gate G2, another input of which receives the signal S2. Inversely, the signal NOSC is applied to a NOR gate G3, another input of which receives the signal S1.

The output of NOR gate G2 forms the output S'1 of the stage BS, this output is used afterwards for the generation of signals Phi1 and Phi2. The signal S'1 has a positive-going edge triggered by the negative-going edge of S2 and a negative-going edge triggered by the signal OSC.

In the same way, the output of G3 forms output S'2 of the stage. The signal S'2 has a negative-going edge triggered by the signal NOSC and a positive-going edge triggered by the signal S1.

The signal S'1 is inverted in two cascaded successive inverters I4 and I5, the input of the first one being connected to the output of gate G2 and the output of the second one forming the output S1. In the same way, the signal S'2 is inverted in two cascaded successive inverters I6 and I7, the input of the first one being connected to the output of gate G3 and the output of the second one being connected to the output S2.

Both signals S1 and S2 are delayed (by the two respective inverters) with respect to signals S'1 and S'2. The signals S'1 and S'2 form two non-overlapping complementary phases, as signals S1 and S2 do.

The preferred arrangement of the output stages, bootstrapped and non-bootstrapped, is illustrated in FIG. 7.

The non-bootstrapped stage ES1, which generates signals Phi1 and Phi2, receives as inputs the four signals S1, S'1, S2 and S'2 from the phase splitter stage. S1 and S'1 are applied to the inputs of NOR gate G4; the output of gate G4 is inverted in inverter I8 to generate the signal Phi1. The signal Phi1 switches between two logic levels 0 and Vcc because the inverter I8 is supplied with a voltage Vcc.

In the same way, the signals S2 and S'2 are applied to the input of a NOR gate G5 whose output is inverted by inverter I9 to generate the signal Phi2 which switches between 0 and Vcc and is complementary to Phi1 and non-overlapping with Phi1.

The bootstrapped output stage is slightly more complex. It receives as inputs the signals S1 and S2 as well as the signals OSC and NOSC. In addition, Besides, it receives the signals S'1 and S'2.

The signal S1 is delayed by a delay circuit comprising, for instance, series inverters I10 and I11, and a capacitor C3 being connected between the output of the first inverter (I10) and ground, according to the arrangement shown in FIG. 7. The delayed signal appears at the output of I11 and is called S1r. In the same way, the signal S2 is delayed by an identical delay circuit (I12, I13, C4); the delayed signal is designated S2r. The induced delay is slightly greater (owing to C3 or C4) than that induced by the two series-connected inverters.

The stage ES2 comprises, in addition to the delay circuits, two NOR gates G6 and G7 with three inputs each. The gate G6 receives the OSC signal, the signal S2, and the signal S1r. Its output S3 generates a square pulse while the signal OSC is at the low level. The square pulse has a positive-going edge triggered by the negative-going edge of S2, and a negative-going edge triggered by the positive-going edge of the following S1r. Conversely, the NOR gate G7 receives NOSC, S1, and S2r. Its output S4 delivers, while OSC is at the high level, a square pulse whose positive-going edge is triggered by the negative-going edge of S1 and whose negative-going edge is triggered by the positive-going edge of S2r.

The square pulses S3 and S4 are used for the achievement of the precharging phase of stage ES2 outputs Phi1b and Phi2b, respectively, prior to the bootstrapped switching phase, which is triggered by signals S1r and S2r, respectively.

To this end, the output S3 of the NOR gate G6 is connected to the control gate of transistor Q1 whose source is connected to the supply Vcc and whose drain is connected to the output Phi1b. A capacitor C5 is connected between the output S1r of the delay circuit (I10, I11, C3) and Phi1b. During the square pulse S3, the transistor Q1 is made conductive and Phi1b rises to level Vcc; since, at this time, the signal S1r is at the low level, the capacitor C5 tends to get charged to Vcc. Afterwards, towards the end of the square pulse S3, the transistor Q1 changes to the off-state, which isolates the output Phi1b from the terminal Vcc, and S1r rises to the high level Vcc, which abruptly raises the potential of Phi1b to above Vcc, due to the energy previously stored in C5. The bootstrap effect is thus achieved on the signal Phi1b.

The signal Phi1b is reset by transistor Q2, which is connected between the output Phi1b and ground and is made conductive by signal S'2.

The generation of the bootstrapped signal Phi2b is by the same method, using an array Q3, C6, Q4 identical with array Q1, C5, Q2, and receiving the signals S2r, S'1, S4 instead of S1r, S'2 and S3.

With the arrangement according to the invention, the oscillator OS is only loaded by inverter I3, gate G2, and gate G6. Its frequency is little affected by such a small load.

The outputs Phi1, Phi2, Phi1b, and Phi2b are loaded by the n stages of the charge pump, but their ability to control these n stages depends only on the dimensioning of the final components (transistors and capacitors) of the output stages and these final components do not affect the oscillator load.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A charge pump comprising:

a stage of a voltage-boosting circuit comprising a transistor and a capacitor; and a transistor switching control circuit coupled to the stage and controlling the switching of the transistor, the transistor switching control circuit comprising:

a ring oscillator generating an oscillator signal at an oscillator frequency;

a phase splitter stage receiving the oscillator signal and generating a plurality of non-overlapping phase-split signals substantially at the oscillator frequency;

a non-bootstrapped output stage, receiving the plurality of non-overlapping phase-split signals, and generating a plurality of non-bootstrapped non-overlapping output signals that switch between a zero voltage and a supply voltage substantially at the oscillator frequency; and a bootstrapped output stage, receiving the plurality of non-overlapping phase-split signals, and generating a plurality of bootstrapped non-overlapping output signals that switch between the zero voltage and a voltage of greater magnitude than the supply voltage substantially synchronously with the non-bootstrapped non-overlapping output signals.

2. The charge pump of claim 1 wherein the ring oscillator comprises no more than three logic gates.

3. The charge pump of claim 2 wherein at least one of the logic gates in the ring oscillator is a threshold inverter.

4. The charge pump circuit of claim 1, wherein the ring oscillator generates the oscillator signal independent from the phase-split stage, the non-bootstrapped output stage, and the bootstrapped output stage, to prevent interference between the oscillator signal and the bootstrapped output signals and the non-bootstrapped output signals.

5. The charge pump of claim 1, wherein:

the plurality of non-overlapping phase-split signals includes a first signal and a second signal that are non-overlapping with respect to one another, and a third signal and a fourth signal that are non-overlapping with respect to one another; and the non-bootstrapped output stage includes a circuit having an input that receives the plurality of non-overlapping phase-split signals, the circuit combining the first signal and the third signal and combining the second signal and the fourth signal to generate the plurality of non-bootstrapped non-overlapping output signals.

6. A charge pump comprising:

means using a switching technique for creating a voltage of greater magnitude than a supply voltage; and means for controlling the switching technique, comprising:

first means for receiving an oscillator signal at an oscillator frequency and generating a plurality of intermediate signals;

second means for receiving the plurality of intermediate signals and generating a first plurality of phase-split signals, each of the first plurality of phase-split signals switching between a first voltage and a second voltage; and third means for receiving the plurality of intermediate signals and generating a second plurality of phase-split signals, each of the second plurality of phase-split signals switching between the first voltage and a third voltage that is different from the second voltage.

7. The charge pump of claim 6 wherein the first plurality of phase-split signals are non-overlapping and the second plurality of phase split signals are non-overlapping.

8. The charge pump of claim 6 wherein the second voltage is the supply voltage.

9. The charge pump of claim 6 wherein each of the first plurality of phase-split signals has a frequency that is substantially equal to the oscillator frequency, and wherein each of the second plurality of phase-split signals has a frequency that is substantially equal to the oscillator frequency.

10. The charge pump of claim 6, wherein the second means includes means for combining at least two of the plurality of intermediate signals to generate the first plurality of phase-split signals.

11. A charge pump comprising: means using a switching technique for creating a voltage of greater magnitude than a supply voltage; and means for controlling the switching technique comprising:
   oscillator means for generating an oscillator signal at an oscillator frequency;
   phase-split means for receiving the oscillator signal and generating a plurality of non-overlapping phase-split signals at the oscillator frequency;
   non-boosting generator means for receiving the plurality of non-overlapping phase-split signals and generating a plurality of non-bootstrapped non-overlapping output signals switching between a zero voltage and the supply voltage substantially at the oscillator frequency; and
   boosting generator means for receiving the plurality of non-overlapping phase-split signals and generating a plurality of bootstrapped non-overlapping output signals, the bootstrapped non-overlapping output signals switching between the zero voltage and a voltage of greater magnitude than the supply voltage and switching substantially synchronously with the non-bootstrapped non-overlapping output signals.

12. The charge pump circuit of claim 11, wherein the oscillator means generates the oscillator signal independent from the phase-split means, the non-boosting generator means, and the boosting generator means, to prevent interference between the oscillator signal and the bootstrapped signals and the non-bootstrapped signals.

13. The charge pump of claim 11, wherein:
   the plurality of non-overlapping phase-split signals includes a first signal and a second signal that are non-overlapping with respect to one another, and a third signal and a fourth signal that are non-overlapping with respect to one another; and
   the non-boosting generator means includes means for combining the first signal and the third signal, and tier combining the second signal and the fourth signal, to generate the plurality of non-bootstrapped non-overlapping output signals.

14. A charge pump comprising:
a voltage-boosting circuit;
first means for receiving an oscillator signal and generating a plurality of intermediate signals;

second means, coupled to the voltage-boosting circuit and responsive to the plurality of intermediate signals, for providing a first plurality of phase-split signals to the voltage-boosting circuit, each of the first plurality of phase-split signals switching between a first voltage and a second voltage; and third means, coupled to the voltage-boosting circuit and responsive to the plurality of intermediate signals, for providing a second plurality of phase-split signals to the voltage-boosting circuit, each of the second plurality of phase-split signals switching between a first voltage and a third voltage that is different from the second voltage.

15. The charge pump of claim 14, further comprising an oscillator, coupled to the first means, the oscillator having an output that provides the oscillator signal, the oscillator generating the oscillator signal independently from the first, second and third means.

16. The charge pump of claim 14, wherein the first plurality of phase-split signals includes a plurality of non-overlapping bootstrapped signals and the second plurality of phase split signals includes a plurality of non-overlapping, non-bootstrapped signals, the non-overlapping, non-bootstrapped signals having a voltage that switches at the oscillator frequency between a zero voltage and a supply voltage, the plurality of non-overlapping bootstrapped signals having a voltage that switches at the oscillator frequency between the zero voltage and a voltage of greater magnitude than the supply voltage.

17. The charge pump of claim 16, further comprising an oscillator, coupled to the first means, the oscillator having an output that provides the oscillator signal, the oscillator generating the oscillator signal independently from the first, second, and third means.

18. The charge pump of claim 14, wherein:
   the plurality of intermediate signals includes a first signal and a second signal that are non-overlapping with respect to one another, and a third signal and a fourth signal that are non-overlapping with respect to one another; and
   the second means includes means for combining the first signal and the third signal, and for combining the second signal and the fourth signal, to generate the first plurality of phase-split signals.

19. An apparatus comprising:
a charge pump circuit for creating an output voltage of greater magnitude than a supply voltage in response to signals received at an input of the charge pump circuit; and
a control circuit, coupled to the charge pump circuit, the control circuit having an input that receives an oscillator signal at an oscillator frequency, a first output that provides a first plurality of phase-split signals to the input of the charge pump circuit, each of the first plurality of phase-split signals switching between a first voltage and a second voltage, and a second output that provides a second plurality of phase-split signals to the input of the charge pump circuit, each of the second plurality of phase-split signals switching between a first voltage and a third voltage that is different from the second voltage;

wherein the control circuit includes;
a phase splitter, having an input that receives that receives the oscillator signal, a first output that provides a first plurality of internal signals, and a second output that provides a second plurality of internal signals;

a first output stage, having an input that receives the first plurality of internal signals and the second plurality of internal signals and an output that provides the first plurality of phase-split signals; and a second output stage, having an input that receives the first plurality of internal signals and the second plurality of internal signals and an output that provides the second plurality of phase-split signals.

20. The apparatus of claim 19 wherein the second voltage is the supply voltage.

21. The apparatus of claim 19 wherein each of the first plurality of phase-split signals has a frequency that is substantially equal to the oscillator frequency, and wherein each of the second plurality of phase-split signals has a frequency that is substantially equal to the oscillator frequency.

22. The apparatus of claim 19, further comprising an oscillator having an output that provides the oscillator signal to input of the control circuit.

23. The apparatus of claim 19 wherein the first plurality of phase-split signals includes two signals that are non-overlapping, and the second plurality of phase split signals includes two signals that are non-overlapping.

\* \* \* \* \*

UNITED STATES PATENT AND TRADEMARK OFFICE
CERTIFICATE OF CORRECTION

| | |
|---|---|
| PATENT NO. | : 5,589,793 |
| APPLICATION NO. | : 08/128871 |
| DATED | : December 31, 1996 |
| INVENTOR(S) | : Christian G. Kassapian |

It is certified that error appears in the above-identified patent and that said Letters Patent is hereby corrected as shown below:

Column 7, line 59, "tier" should be --for--

Column 8, line 11, "a" should be --the--

Column 8, line 18, after "second" insert --,--

Column 8, line 59, "a" should be --the--

Column 8, line 63, delete second occurrence of "that receives"

Signed and Sealed this

Ninth Day of February, 2010

David J. Kappos
*Director of the United States Patent and Trademark Office*